United States Patent

Healy

(10) Patent No.: US 8,371,497 B2
(45) Date of Patent: Feb. 12, 2013

(54) METHOD FOR MANUFACTURING TIGHT PITCH, FLIP CHIP INTEGRATED CIRCUIT PACKAGES

(75) Inventor: Christopher James Healy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 27 days.

(21) Appl. No.: 12/482,668

(22) Filed: Jun. 11, 2009

(65) Prior Publication Data

US 2010/0314433 A1    Dec. 16, 2010

(51) Int. Cl.
B23K 31/02    (2006.01)
B23K 35/34    (2006.01)
B23K 101/40   (2006.01)

(52) U.S. Cl. .............. 228/180.22; 228/180.21; 228/223; 228/225; 228/259; 438/612

(58) Field of Classification Search ............. 228/180.22, 228/259, 223, 225; 438/612
See application file for complete search history.

(56) References Cited

U.S. PATENT DOCUMENTS

| | | | |
|---|---|---|---|
| 4,938,383 A * | 7/1990 | Yamazaki et al. ............. | 222/41 |
| 5,111,991 A * | 5/1992 | Clawson et al. ........... | 228/180.1 |
| 5,186,982 A | 2/1993 | Blette et al. | |
| 5,435,481 A * | 7/1995 | Da Costa Alves et al. ... | 228/223 |
| 5,825,629 A | 10/1998 | Hoebener et al. | |
| 5,909,839 A * | 6/1999 | Belke et al. ................. | 228/248.1 |
| 5,985,043 A * | 11/1999 | Zhou et al. ...................... | 148/24 |
| 6,062,460 A | 5/2000 | Sato | |
| 6,335,571 B1 * | 1/2002 | Capote et al. ................. | 257/787 |
| 6,344,690 B1 | 2/2002 | Kitajima et al. | |
| 6,695,200 B2 * | 2/2004 | Suzuki et al. ............ | 228/180.22 |
| 6,930,399 B2 | 8/2005 | Paik et al. | |
| 6,981,317 B1 * | 1/2006 | Nishida ........................... | 29/840 |
| 7,576,434 B2 * | 8/2009 | Mancera et al. ............... | 257/777 |
| 2004/0178481 A1 | 9/2004 | Joshi et al. | |
| 2007/0164079 A1 * | 7/2007 | Mori et al. ..................... | 228/101 |
| 2007/0222053 A1 | 9/2007 | Wei et al. | |
| 2008/0029849 A1 | 2/2008 | Hedler et al. | |
| 2008/0156851 A1 | 7/2008 | Ramanan et al. | |
| 2008/0206587 A1 | 8/2008 | Kainuma et al. | |
| 2009/0014501 A1 * | 1/2009 | Nishi et al. .................... | 228/103 |

FOREIGN PATENT DOCUMENTS

| | | |
|---|---|---|
| JP | 61060264 A | 3/1986 |
| JP | 2002026505 A | 1/2002 |

OTHER PUBLICATIONS

International Search Report and Written Opinion—PCT/US2010/038344, International Search Authority—European Patent Office—Sep. 21, 2011.

* cited by examiner

*Primary Examiner* — Devang R Patel
(74) *Attorney, Agent, or Firm* — Michelle Gallardo; Nicholas J. Pauley; Jonathan T. Velasco

(57) ABSTRACT

A flip chip packaging method to attach a die to a package substrate, the method including dipping the die into solder paste; placing the die onto the package substrate; and reflowing the solder paste to attach the die to the package substrate. Other embodiments are described and claimed.

19 Claims, 4 Drawing Sheets

A

B

C

D

METHOD FOR MANUFACTURING TIGHT PITCH, FLIP CHIP INTEGRATED CIRCUIT PACKAGES

FIELD

The present invention relates to packaging of integrated circuits, and more particularly to flip chip integrated circuit packages.

BACKGROUND

In a flip chip packaged integrated circuit, or simply "flip chip" for short, a die (chip) containing the integrated circuit has its active side facing a package substrate. In the flip chip process, also formally called the Controlled Collapse Chip Connection (C4) evaporative bump process, conductive bumps are formed and soldered to pads on the active side. The solder bumped die is then placed face down onto matching bonding pads on a multilayer organic package substrate. The assembly is reflowed so that the conductive bumps are soldered to pads on the package substrate to provide electrical connection between the active side of the integrated circuit and the package substrate. This electrical connection forms part of the so-called level 1 interconnect. The conductive bumps also provide a load bearing link between the die and the package substrate. Usually, the conductive bumps comprise solder.

After the die is attached to the substrate, an epoxy resin (or underfill) is usually applied at the interface between the die and the package substrate to help compensate for the difference in the coefficient of thermal expansion (CTE) between the die and the package substrate, and to prevent moisture from getting to the die surface. The flip chip may also be capped with a liquid epoxy for further protection.

FIG. 1 illustrates in simplified form a process comprising three steps to attach and solder the conductive bumps on a flip chip die to the package substrate, where the steps are labeled in sequential order as "A", "B", and "C". In step A, die 102 held by tool 104 is dipped into flux resin 106. Arrow 108 pictorially represents this dipping process, where conductive bumps 110 are dipped into flux resin 106 and then pulled out. In step B, the numeric label 112 denotes solder wetting conductive bumps 110. Arrow 114 pictorially represents die 102 being placed onto package substrate 116. In step C, wavy lines 118 pictorially represent heat being applied to cause reflow of the solder so that conductive bumps 110 are soldered to pads (not shown) on package substrate 116.

As integrated circuits become more complex with higher numbers of input and output pads with a corresponding increase in the number of conductive bumps, the pitch of the conductive bumps is expected to increase. However, some problems that may arise with a tighter pitch using a reflow and attach process such as that illustrated in FIG. 1 are, to name just a few: opens or shorts leading to lower yield, poor wettability of the solder on the conductive bumps, and electrical connections between conductive bumps and pads that may fail over time. Warping of the die and package substrate may increase the likelihood of these problems.

A low cost manufacturing process to attach a die to a package substrate resulting in good yield and reliability in a tight pitch, flip chip integrated package is of utility.

SUMMARY

In an embodiment, a die is dipped into solder paste, placed onto a package substrate, and then the solder paste is reflowed to attach the die to the package substrate.

In another embodiment, to attach a die to a package substrate, solder paste is applied to the package substrate, the die is placed onto the package substrate before reflow of the solder paste; and then the solder paste is reflowed to attach the die to the package substrate.

In another embodiment, to attach a die to a package substrate, solder paste is dispensed onto pads on the package substrate, the die is placed onto the package substrate before reflow of the solder paste, and then the solder paste is reflowed to attach the die to the package substrate.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
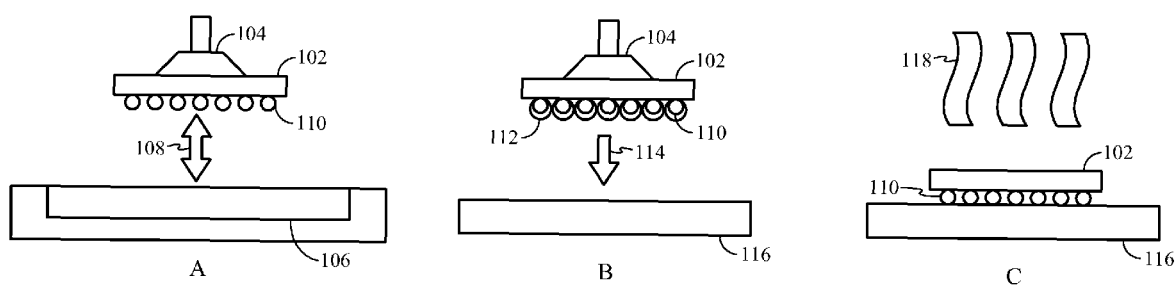
FIG. 1 illustrates a conventional process in flip chip manufacturing.
Figure 2:
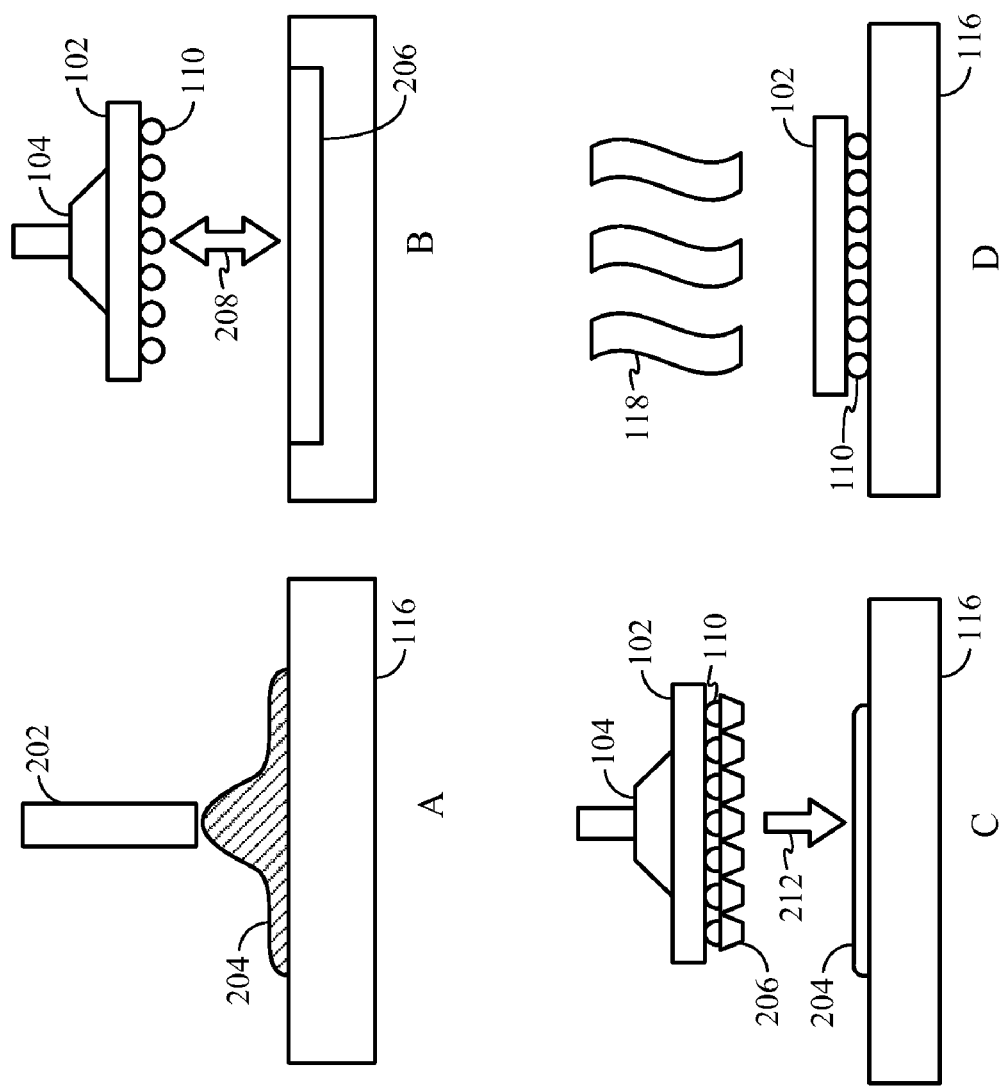
FIG. 2 illustrates a process to attach and solder the conductive bumps on a die to pads on a package substrate according to an embodiment.

FIG. 2 illustrates a process to attach and solder the conductive bumps on a die to pads on a package substrate according to an embodiment, with sub-figures in FIG. 2 labeled as "A", "B", "C", and "D", where these labels do not necessarily imply a sequential order. For example, the process illustrated as "A" in FIG. 2 need not be part of an embodiment, or if it is to be included in an embodiment, then it need not necessarily be performed before the process labeled as "B".

In "A" of FIG. 2, a jet flux process is used whereby tool 202 applies (e.g., sprays) flux resin 204 onto package substrate 116. In "B" of FIG. 2, die 102 is dipped into solder paste 206 and then removed, where arrow 208 pictorially represents this dipping process. Solder paste 206 may be, for example, a combination of flux and particulate solder. In the dipping process in "B", the bottom portions of conductive bumps 110 are put into contact with solder paste 206 such that when tool 104 removes conductive bumps 110 from solder paste 206, there is no wetting between conductive bumps 110 that may lead to shorts. Sub-figure "C" of FIG. 2 illustrates solder paste 206 wetting the bottom surfaces of conductive bumps 110, such that there is no bridging of solder between the conductive bumps to cause a short. Arrow 212 pictorially represents placing die 102 onto package substrate 116.

If the process indicated in "A" of FIG. 2 is performed, then flux resin 204 is already on package substrate 116 in the process of "C", but for some embodiments the process indicated by "A" in FIG. 2 may not be performed so that flux resin 204 may not be present on package substrate 116 in the process of "C". For some embodiments, flux resin 204 may have a thickness of around 5 to 15 μm. The use of flux resin 204 may increase the wettability of solder paste 206 when the process "C" in FIG. 2 is performed.

In "D" of FIG. 2, wavy lines 118 pictorially represent applying heat so as to reflow solder paste 206 in order to solder and attach conductive bumps 110 to pads (not shown) on package substrate 116.

Figure 3:
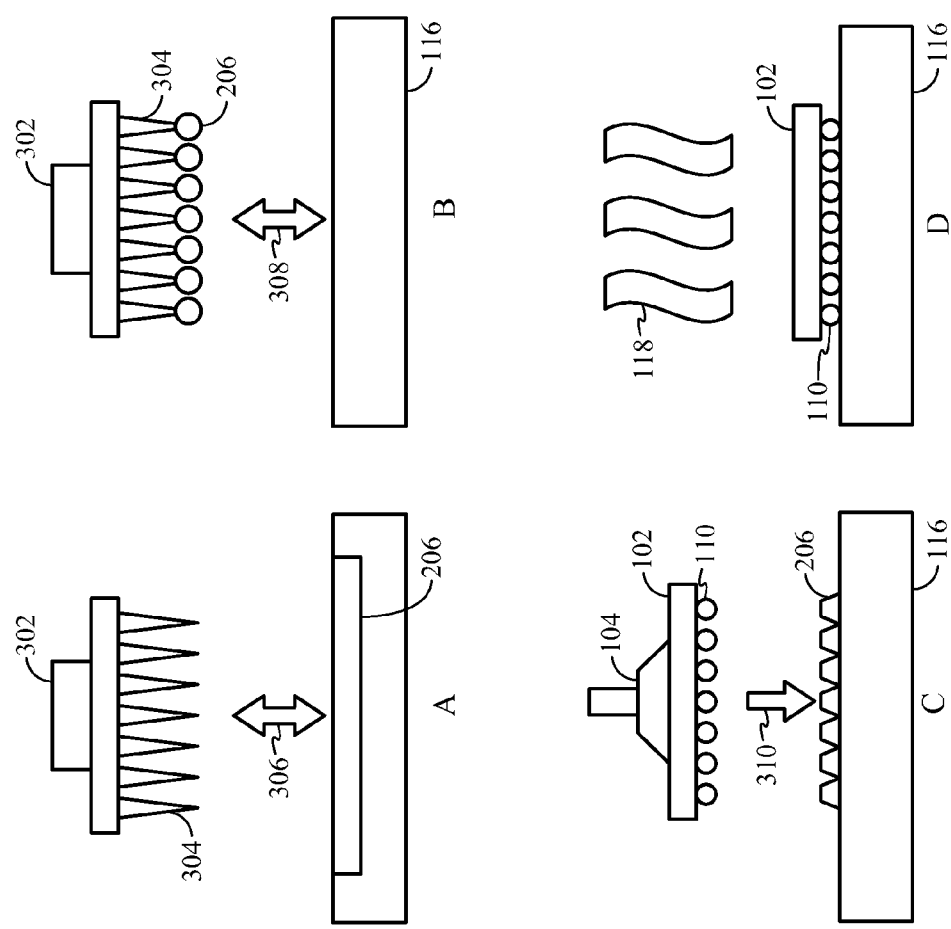
FIG. 3 illustrates a process to attach and solder the conductive bumps on a die to pads on a package substrate according to another embodiment.

FIG. 3 illustrates a process to attach and solder the conductive bumps on a die to pads on a package substrate according to another embodiment. Sub-figures in FIG. 3 are labeled as "A", "B", "C", and "D", where the alphabetical order of these labels implies a sequential order. In process "A" of FIG. 3, tool 302 comprising multiple needles 304 is dipped into solder paste 206 and then removed, as pictorially represented by arrow 306. Needles 304 have the same array pattern as conductive bumps 110 on die 102.

In process "B" of FIG. 3, solder paste 206 wets the tips of needles 304, where arrow 308 pictorially represents placing the tips of needles 304 close to package substrate 116 to dispense solder paste 206 onto package substrate 116.

Process "C" of FIG. 3 illustrates that solder paste 206 has been dispensed onto package substrate 116 to form drops of solder paste 206 at the same pitch as conductive bumps 110. Arrow 310 pictorially represents placing die 102 onto package substrate 116 so that conductive bumps 110 come into contact with corresponding drops of solder paste 206.

In process "D" of FIG. 3, wavy lines 118 pictorially represent the application of heat to cause reflow of solder paste 206 so that conductive bumps 110 are soldered to pads (not shown) on package substrate 116.

Figure 4:
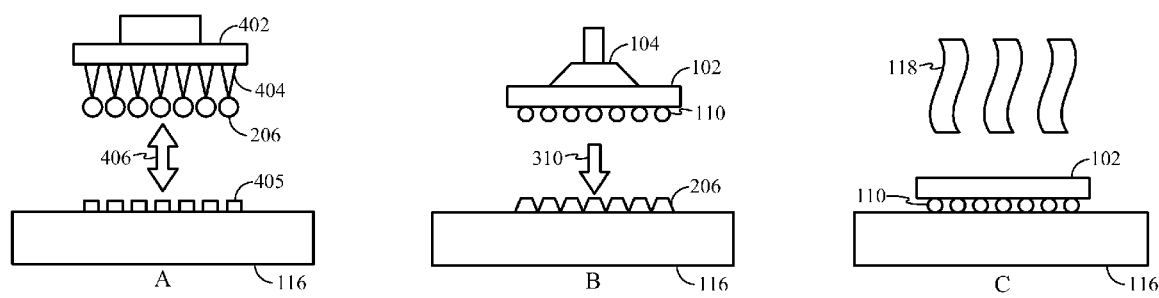
FIG. 4 illustrates a process to attach and solder the conductive bumps on a die to pads on a package substrate according to another embodiment.

FIG. 4 illustrates a process to attach and solder the conductive bumps on a die to pads on a package substrate according to another embodiment. Sub-figures in FIG. 4 are labeled as "A", "B", and "C", where the alphabetical order of these labels implies a sequential order. In process "A" of FIG. 4, tool 402 comprising multiple needles 404 dispenses solder paste 206 onto pads 405 on package substrate 116. Needles 404 have small openings at their tips so that when under pressure, solder paste 206 flows through these openings so that drops of solder paste 206 may be dispensed onto pads 405 on package substrate 116. The process of bringing tool 402 close to package substrate 116, dispensing solder paste 206, and bringing tool 402 away is pictorially represented by arrow 406. Needles 404 have the same array pattern as conductive bumps 110 on die 102.

Processes "B" and "C" in FIG. 4 are the same, respectively, as processes "C" and "D" in FIG. 3, so that part of the description for the embodiment of FIG. 3 need not be repeated with respect to FIG. 4. (For ease of illustration, pads 405 are now shown in processes "B" and "C" of FIG. 4.)

Additional processes well known in the technology of flip chip packaging, such as applying underfill to the interface between die 102 and package substrate 116 in FIGS. 2, 3, and 4, may be performed, but are not shown in these figures for ease of illustration. Also, pads, under bump metallization layers, and other protective layers, such as for example oxide surface protectant layers, are well known but are not shown in all or some of these figures for ease of illustration.

Various modifications may be made to the described embodiments without departing from the scope of the invention as claimed below.

What is claimed is:

1. A method to attach a die to a package substrate, the method comprising:
    applying a single continuous layer of flux resin having a thickness of approximately 5 to 15 micrometers to the package substrate, wherein pads are located on the package substrate, and wherein the flux resin covers the pads on the package substrate;
    dipping at least a portion of the die into solder paste;
    placing the dipped die onto the package substrate after applying the flux resin, wherein the at least a portion of the dipped die is placed directly onto the applied flux resin; and
    after placing the dipped die onto the package substrate to provide electrical connection between the die and the pads on the package substrate, reflowing the solder paste remaining on the portion of the die to attach the die to the package substrate, wherein underfill is applied between the dipped die and the package substrate after reflowing the solder paste.

2. The method of claim 1, wherein the die has conductive bumps, and wherein dipping the die into the solder paste comprises dipping the conductive bumps into the solder paste.

3. The method of claim 2, wherein reflowing the solder paste to attach the die to the package substrate comprises:
    applying heat to the dipped die, wherein the heat is first applied to the dipped die subsequent to placing the dipped die onto the package substrate; and
    soldering the conductive bumps to the pads.

4. The method of claim 1, wherein the die has conductive bumps and wherein reflowing the solder paste to attach the die to the package substrate comprises soldering the conductive bumps to the pads.

5. The method of claim 1, wherein the solder paste is a combination of flux and particulate solder.

6. The method of claim 1, wherein the flux resin has a thickness in the range of 5 micrometers and 15 micrometers.

7. The method of claim 2, wherein there is no wetting between the conductive bumps.

8. A method to attach a die to a package substrate, the method comprising:
    a step for applying a single continuous layer of flux resin having a thickness of approximately 15 micrometers to the package substrate, wherein pads are located on the package substrate, and wherein the flux resin covers the pads on the package substrate;
    a step for dipping at least a portion of the die into solder paste; and
    a step for placing the dipped die onto the package substrate after applying the flux resin, wherein the at least a portion of the dipped die is placed directly onto the applied flux resin; and
    a step for reflowing the solder paste remaining on the portion of the die to attach the die to the package substrate, wherein underfill is applied between the die dipped and the package substrate after reflowing the solder paste.

9. The method of claim 8, wherein the die has conductive bumps, and wherein dipping the die into the solder paste comprises dipping the conductive bumps into the solder paste.

10. The method of claim 9, wherein reflowing the solder paste to attach the die to the package substrate comprises soldering the conductive bumps to the pads.

11. The method of claim 9, wherein there is no wetting between the conductive bumps.

12. The method of claim 9, wherein only a bottom portion of the conductive bumps is dipped into the solder paste within a solder paste container.

13. The method of claim 8, wherein the die has conductive bumps and wherein reflowing the solder paste to attach the die to the package substrate comprises soldering the conductive bumps to the pads.

14. The method of claim 1, wherein applying the flux resin to the package substrate comprises spraying the flux resin onto the package substrate.

15. The method of claim 1, wherein the single continuous layer of the flux resin has a thickness of approximately 5 micrometers.

16. The method of claim 8, wherein the step for applying includes spraying the flux resin onto the package substrate.

17. The method of claim 16, further comprising a step for applying heat to the dipped die, wherein the heat is first applied to the dipped die subsequent to the step for placing.

18. The method of claim 1, wherein reflowing the solder paste to attach the die to the package substrate comprises applying heat to the dipped die, wherein the heat is first applied to the dipped die subsequent to placing the dipped die onto the package substrate.

19. The method of claim 1, wherein after applying the flux resin to the package substrate, no additional material is deposited on the flux resin until the dipped dies is placed onto the package substrate.

* * * * *